(12) United States Patent
Deppe et al.

(10) Patent No.: US 7,145,807 B2
(45) Date of Patent: Dec. 5, 2006

(54) METHOD FOR OPERATING AN ELECTRICAL WRITABLE AND ERASABLE MEMORY CELL AND A MEMORY DEVICE FOR ELECTRICAL MEMORIES

(75) Inventors: Joachim Deppe, Dresden (DE); Mark Isler, Dresden (DE); Christoph Ludwig, Langebrück (DE); Jens-Uwe Sachse, Dresden (DE); Jan-Malte Schley, Dresden (DE); Ricardo Pablo Mikalo, Waltersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/072,694

(22) Filed: Mar. 4, 2005

(65) Prior Publication Data

US 2005/0195650 A1    Sep. 8, 2005

(30) Foreign Application Priority Data

Mar. 5, 2004    (DE)    ...................... 10 2004 010 840

(51) Int. Cl.
  *G11C 11/34*    (2006.01)
  *G11C 16/06*    (2006.01)
  *G11C 16/04*    (2006.01)

(52) U.S. Cl. ........................... 365/185.28; 365/185.03; 365/185.24

(58) Field of Classification Search ........... 365/185.01, 365/185.03, 185.28, 185.18, 185.24; 257/314
See application file for complete search history.

(56) References Cited

U.S. PATENT DOCUMENTS

| 5,768,192 | A  | 6/1998  | Eitan |
| 6,011,725 | A  | 1/2000  | Eitan |
| 6,215,148 | B1 | 4/2001  | Eitan |
| 6,348,711 | B1 | 2/2002  | Eitan |
| 6,477,084 | B1 | 11/2002 | Eitan |
| 6,664,588 | B1 | 12/2003 | Eitan |

FOREIGN PATENT DOCUMENTS

| WO | WO 98/03977 | 1/1998  |
| WO | WO 99/60631 | 11/1999 |

OTHER PUBLICATIONS

Eitan, B., "NROM: A Novel Localized Trapping, 2-Bit Nonvolatile Memory Cell," IEEE Electron Device Letters, vol. 21, No. 11, Nov. 2000, pp. 543-545.

*Primary Examiner*—Amir Zarabian
*Assistant Examiner*—Michael Weinberg
(74) *Attorney, Agent, or Firm*—Slater & Matsil, L.L.P.

(57)    ABSTRACT

A method is provided for operating an electrical writable and erasable memory cell, which has a channel region that can be operated in a first and a second direction, wherein information is stored as the difference of an effective parameter.

11 Claims, 3 Drawing Sheets

PRIOR ART

PRIOR ART

METHOD FOR OPERATING AN ELECTRICAL WRITABLE AND ERASABLE MEMORY CELL AND A MEMORY DEVICE FOR ELECTRICAL MEMORIES

This application claims priority to German Patent Application 102004010840.4, which was filed Mar. 5, 2004, and is incorporated herein by reference.

TECHNICAL FIELD

The invention relates to a method for operating an electrical writable and erasable memory cell and a memory device for the electrical writable and erasable non-volatile memory cells.

BACKGROUND

Electrical writable and erasable non-volatile memory cells, which can especially be used in a virtual ground NOR architecture, also include so-called charge trapping memory cells, in which, between the channel region and/or the source/drain region and the gate electrode, there is a part of the gate dielectric having a non-conducting memory layer between boundary layers for the trapping of charge carriers and thus for changing the programming state of the memory cell. Such memory cells are described for example in U.S. Pat. No. 5,768,192, U.S. Pat. No. 6,011,725 and PCT Patent Publication WO 99/60631. In these memory cells each boundary layer is an oxide and the memory layer is a nitride of the semiconductor material, usually silicon.

Charge-trapping memory cells are preferably programmed by channel hot electrons (CHE) and can be erased with hot holes from the channel region or by Fowler-Nordheim tunnels. A SONOS memory cell provided for a special operating mode with a read voltage (reverse-read) applied in the opposite direction to the programming process, having a thickness of the boundary layers matched to this operating mode, is usually designated as an NROM memory cell. Further details on this can be found in Boaz Eitan et al.: "NROM: A Novel Localized Trapping, 2-Bit Non-Volatile Memory Cell" in IEEE Electron Device Letters 21, 543–545 (2000).

The memory layer of a charge-trapping memory cell is located between a boundary layer comprising a material having a higher band gap than the band gap of the memory layer so that the charge carriers captured in the memory layer remain localized there. A nitride is preferably considered as material for the memory layer. An oxide is primarily suitable as surrounding material. As an example of such an oxide-nitride-oxide (ONO) memory layer sequence in the material system of silicon, the silicon nitride memory layer is provided with a band gap of about 5 eV. The surrounding boundary layers are silicon oxide having a band gap of about 9 eV.

The memory layer can be a different material whose band gap is smaller than the band gap of the boundary layers wherein the difference of the band gaps should be as large as possible for good electrical confinement of the charge carriers. In conjunction with silicon oxide as the boundary layer, for example, tantalum oxide, hafnium silicate, titanium oxide (in the case of a stoichiometric composition $TiO_2$), zirconium oxide (in the case of a stoichiometric composition $ZrO_2$), aluminum oxide (in the case of a stoichiometric composition $Al_2O_3$), or intrinsically conducting (undoped) silicon can be used as the material of the memory layer.

Such a 2-bit NROM memory cell is programmed, as described for example in PCT Patent Publication WO 98/03977, such that by means of a gate voltage and a drain source voltage in the channel region of the memory cell, a vertical and a lateral electric field is produced which accelerates the electrons along the channel length. Some electrons are accelerated such that in the vicinity of the drain region where the electric field is strongest, they jump over the potential barrier and reach the nitride layer. In this way, the threshold voltage of the channel region changes, which can be detected by applying a read voltage in the reverse direction. The second bit in this memory cell is programmed by exchanging drain and source compared with the previous described programming process for writing the memory cell and thus the significant adjustment of charges into the charge-trapping layer. In this way, 2-bit information can be stored in a non-volatile memory cell, such as an NROM cell for example.

A disadvantage of this known procedure is that during incorporation of charges into the charge trapping layer on one side of such a cell, reactions are observed on the threshold voltage of the respectively other side of the memory cell. So-called crosstalk thus results. The crosstalk increases with increasing difference between the threshold voltages of the two sides of a cell.

That crosstalk may have the following influences. For reading a NROM memory cell a particular gate voltage and particular drain/source voltage is supplied to the cell. Drain and source are defined so that the desired part of the cell will be read. If no charge is stored in the charge-trapping layer a significant drain current will flow if a specific gate voltage is supplied. When a particular charge is stored in the charge-trapping layer (the nitride layer), this charge will hinder the development of a channel between source and drain and no drain current will flow at the same gate voltage or the drain current will be at least significantly lower. This behavior is viewable in a usual transfer characteristic. Programming of one side of the NROM cell can result in a modification of the transfer characteristic of the other side so that, for an example, a drain current will flow even when no charge was stored within the charge trapping layer.

As the technology is further developed, the effective channel length and thus the physical distance between the charges of both sides of a cell decreases. This results in stronger crosstalk. It can thus be reckoned that in the future there will be an increased number of errors that come about as a result of crosstalk.

SUMMARY OF THE INVENTION

In one aspect, the invention provides a memory device for electrical writing and erasing of memory cells and a method for operating such a memory device in which the occurrence of the aforementioned errors is avoided.

Selecting the threshold voltage as an effective parameter will minimize the effect of crosstalk by the fact that too-large threshold voltage differences never come about between the two sides of a cell. This is especially achieved by at least some of the information, namely one bit, being stored as a difference in the threshold voltage of the channel region, which in turn is not influenced by crosstalk and the occurrence of errors as a result of crosstalk in the memory cell is avoided. Furthermore, as a result of programming using a threshold voltage difference the use of a reference cell is avoided. If only the information of the effective parameter difference is used, a one bit memory cell can be achieved having a great reliability.

Further advantageous embodiments are specified in the dependent claims. Especially as a result of the fact that in addition to the threshold voltage difference, a voltage range is specified within which the threshold voltage lies from the absolute magnitude, it can be achieved with this measure that by stipulating two or more voltage ranges, more than two bits can be stored in a memory cell.

The invention is explained subsequently with reference to the drawings using exemplary embodiments.

BRIEF DESCRIPTION OF THE DRAWINGS

For a more complete understanding of the present invention, and the advantages thereof, reference is now made to the following descriptions taken in conjunction with the accompanying drawings, in which.

The following list of reference symbols can be used in conjunction with the figures.

| | |
|---|---|
| 1 | Substrate |
| 2 | Gate structure |
| 3 | Insulation |
| 4 | Clock control |
| 5 | Data output |
| G | Gate connection |
| GL | Gate lead |
| D/S | Drain/source area |
| BL | Bit line |
| C1 | Charge region 1 |
| C2 | Charge region 2 |
| AS | Address control |
| RD | Series decoder |
| ST | State control |
| SA | Write amplifier |
| BD | Multi-bit decoder |
| BLD | Bit line decoder |

DETAILED DESCRIPTION OF ILLUSTRATIVE EMBODIMENTS

Figure 1:
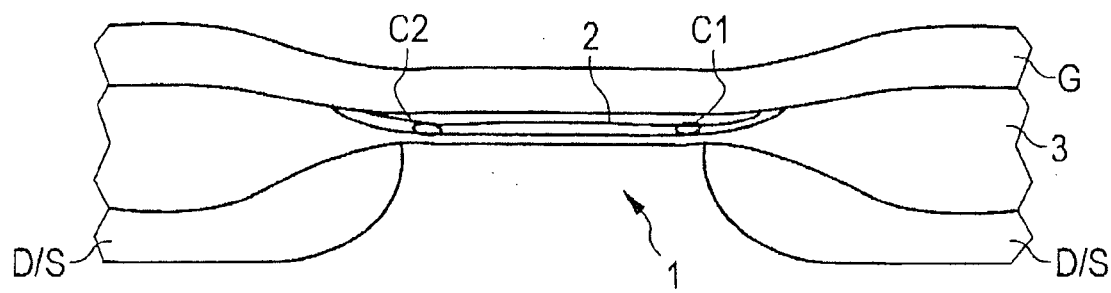
FIG. 1 is a first example of an NROM memory cell.

FIG. 1 shows the fundamental structure of a conventional NROM memory cell. Arranged on a substrate 1 are drain/source regions D/S at a distance from one another, between which a gate structure 2 is constructed. The gate structure 2 includes three layers with the layer succession of an oxide layer, a nitride layer and an oxide layer. The gate structure 2 is completed by a covering gate contact G via, which the gate voltage is applied via the gate structure 2. The gate contact G is in this case separated from the drain/source regions D/S by means of insulation 3 which is an oxide. Thus, the NROM cell corresponds to the structure of an MOS transistor, which is called in the following "the cell transistor."

Thus, as already described in the introduction to the description, depending on which of the two regions D/S is respectively the drain or the source, a charge is stored or deleted in the gate structure 2 in region C2 or in region C1. The charge storing is effected to the nitride layer by a so-called hot electron injection. Erasing is effected by so called Fowler-Nordheim tunneling. In this case, programming takes place in the region C1 or C2 physically adjacent to the respective drain region. The programmed information is detected by the read direction inverse to the programming or writing. Detecting of the stored information is effected by the threshold voltage or cut-off voltage of the cell transistor. Reading the stored charge adjacent to the source region is relevant.

Figure 4:
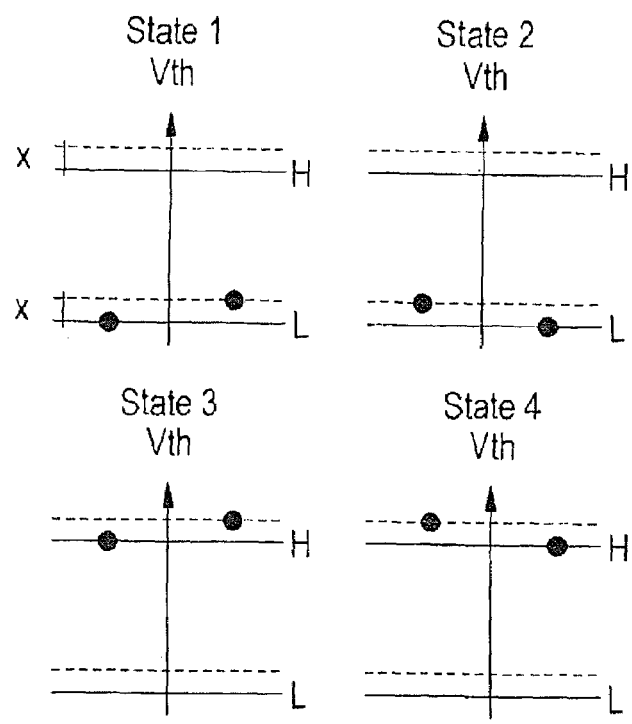
FIG. 4 is an exemplary embodiment of the storage of four states in a non-volatile memory cell.

FIG. 4 shows the programming states in accordance with the state programming according to the invention. In this case, the filled circles respectively show the value of the threshold voltage for the left and right side of a memory cell. In state 1 the threshold voltage in the left region lies below the threshold voltage in the right region wherein the state is consequently determined by the threshold voltage difference determined from left to right on the threshold voltage level L. This means that a memory cell, as shown for example in FIG. 1, is programmed once on the left and once on the right by exchanging drain and source on the "L" level, the programming being accomplished such that the threshold voltage in the right part of the cell is higher than that in the left part and a threshold voltage difference is obtained within one region.

State 2 is now obtained in analogous form, wherein the threshold voltage in the left part is higher than that in the right part. The difference considered absolutely between state 1 and state 2 is the same, with merely the mathematical sign of the difference of the two threshold voltages being decisive for determining the stored logical state.

Figure 5:
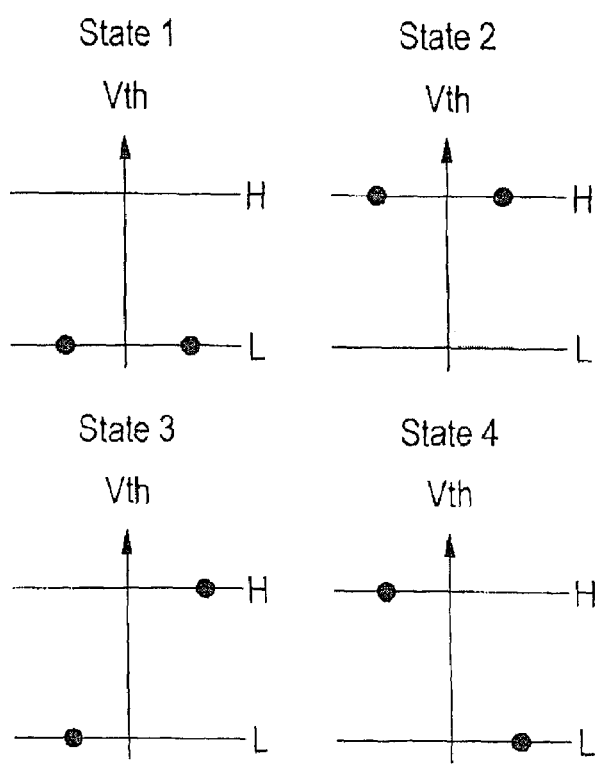
FIG. 5 is the hitherto conventional procedure for storage of four states in a conventional NROM memory cell.

State 3 and state 4 in FIG. 4 are obtained in a comparable fashion to state 1 and state 2, the threshold voltages shown here being located in the range of the "H" level. Here also, the sign of the respective difference is decisive for the difference between state 3 and state 4. The usual programming, as shown in FIG. 5, takes place in the form that, for example, state 1 is defined by the fact that the threshold voltage in the left part of the cell and in the right part of the cell each lie on the "L" level and in contrast, state 2 is defined by the fact that in the left part of the cell and in the right part of the cell the threshold voltage respectively lies on the "L" level. Furthermore, state 3 is defined by the fact that the voltage in the left part of the cell lies on the "L" level and that in the right part lies on the "H" level, with state 4 being defined by the fact that the threshold voltage in the left part of the cell lies on the "H" level and that in the right part lies on the "L" level.

As one possible example the difference of the threshold voltages between the "L" level and the "H" level can be of about 1.5 V and the threshold voltage difference within the "L" level or the "H" level, that means between state 1 and 2 or state 3 or 4 respectively, can be of about 300 mV respectively. However, there are other differences possible in realization.

In the above-mentioned embodiment four states are described distributed on two levels. That means it is a two-bit memory cell. In addition to the "H" level and the "L" level, one or more levels that define additional bits can be stored in one memory cell in an analogous way.

The advantage of the state definition according to FIG. 4 can be seen in the fact that in each case, the difference between the left part of the cell and the right part of the cell is programmed, with both threshold voltage levels lying within the same region. Larger threshold voltage differences never occur between the two sides of one cell.

During programming of state 3 of the known method, the threshold voltage of the right side is significantly raised above that of the left side. Crosstalk can result in the left part of the cell being raised as well.

Figure 2:
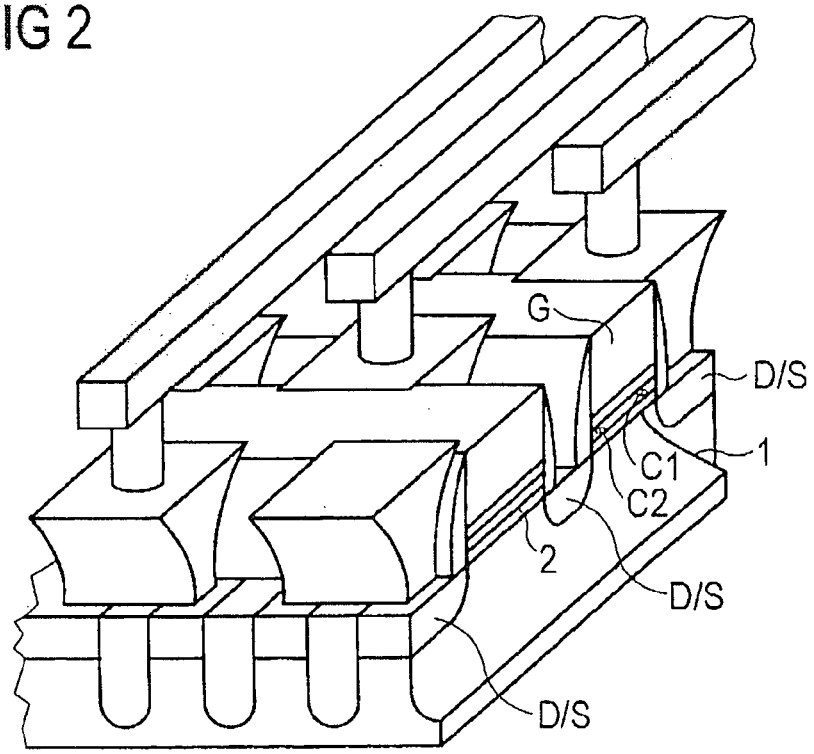
FIG. 2 is a second exemplary embodiment of an NROM memory cell.

A different arrangement of an NROM memory cell is shown in a three-dimensional view according to FIG. 2 wherein the substantial difference is merely to be seen in the contacting of the gate contact G and the drain/source regions D/S compared with the exemplary embodiment shown in FIG. 1. Here also two charge regions C1 and C2 are provided within the gate structure in which charge is embedded or erased. The programming according to the invention can be used for both the exemplary embodiments of NROM memory cells shown and also for other memory cells having a gate structure with at least two local storage areas having influence on an effective parameter, for an example the threshold voltage.

Figure 3:
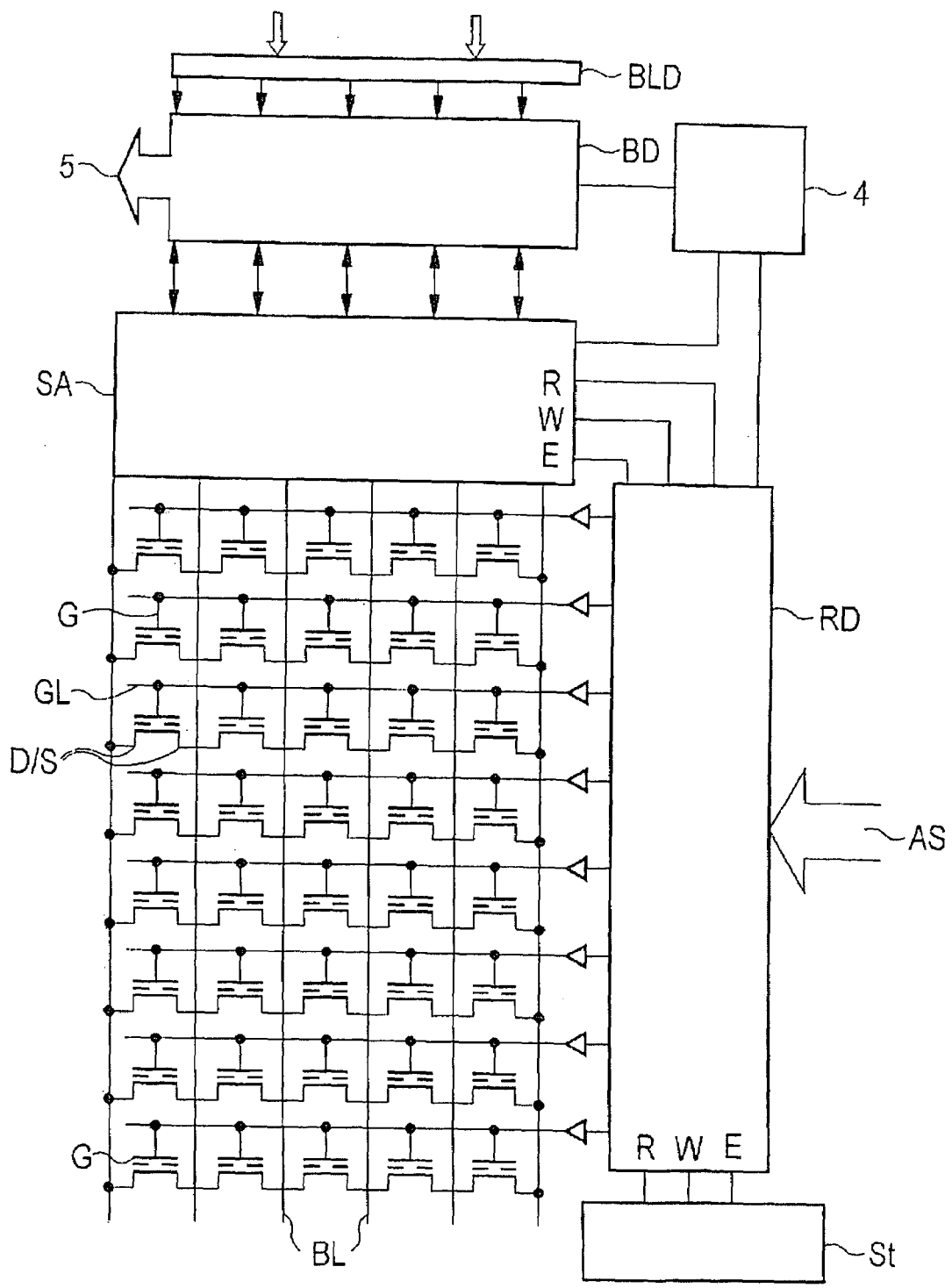
FIG. 3 is a conventional memory cell array for NROM cells.

According to FIG. 3, a conventional memory cell arrangement for non-volatile memories is shown, which can be used for the method according to the invention. A plurality of rows of memory cells is shown wherein in each row one drain/source connection D/S of one cell is connected to one drain/source connection D/S of the neighboring cell. The drain/source connections are connected to bit lines BL and are controlled by means of a so-called sense amplifier SA. The gate connections G of the individual memory cells within one row are controlled by a series decoder RD by means of respective gate lines GL. The memory cells are addressed via the series decoder RD and via a bit line decoder BLD.

Arranged between the bit line decoder BLD and the sense amplifier SA is a multi-bit decoder BD, which ensures that the respective threshold voltage difference is set to the respective desired level, as described previously, during a programming process in the memory cells or which determines the programmed state at the respective level from the threshold voltage difference by forward and backward reading of the respective memory cells and delivers to the data output 5. The multi-bit decoder BD consequently comprises a device for producing a threshold voltage difference in the individual memory cells and a device for detecting such a threshold voltage difference. The interaction between the bit decoder, the sense amplifier and the series decoder RD is controlled via a clock control 4. Finally a state control ST is provided, which specifies whether a read process R, a write process W or an erase process E is provided.

The above embodiment is directed to a NROM cell. However the invention is not restricted to that but can be applied to each memory cell having at least two separate storage areas having influence on an effective parameter of the memory cell.

What is claimed is:

1. A method for operating an electrically writable and erasable memory cell, which has a channel region being operated in a first and a second direction, the memory cell characterized by at least one effective parameter, the method comprising:
   storing information in the memory cell, wherein information is stored as the difference between the effective parameter in operation of the channel region in the first direction and the effective parameter in operation of the channel region in the second direction; and
   retrieving the stored information from the memory cell.

2. The method according to claim 1, wherein two sets of information are distinguished by the direction of operation of the channel region when the effective parameter of the channel region in the first direction is higher than the effective parameter in operation of the channel region in the second direction, wherein the magnitude of the effective parameter difference is the same in each direction.

3. The method according to claim 2, wherein the memory cell includes a memory cell transistor having a threshold voltage and wherein the effective parameter is the threshold voltage of a memory cell transistor.

4. The method according to claim 3, wherein the threshold voltage is stipulated within a pre-determined voltage range.

5. The method according to claim 4, wherein further information is stipulated within further pre-determined voltage ranges.

6. A memory device for electrically readable and erasable information memories, the memory device comprising:
   a memory cell field with at least one memory cell that has a channel region between a drain region and a source region, the channel region being bi-directionally operable, the memory cell further including a storage area that is adjustable such that an effective parameter of the memory cell when operating the channel region in a first direction is different than the effective parameter of the memory cell when operating the channel region in the second direction; and
   a reading device operatively coupled to the memory cell, the reading device operable to determine the difference of the effective parameter of the memory cell when operating the channel region in the first direction and the effective parameter of the memory cell when operating the channel region in the second direction and determine a programming state based upon that difference.

7. The memory device according to claim 6, further comprising a writing device that adjusts the storage urea such that information to be stored is converted into a threshold voltage difference of the channel region.

8. The memory device according to claim 7, wherein the information to be stored comprises one bit.

9. The memory device according to claim 8, wherein the memory cell is an NROM memory cell element.

10. The memory device according to claim 9, wherein the memory cell includes a first oxide layer adjacent the channel region, a nitride layer adjacent the first oxide layer, and a second oxide layer adjacent the nitride layer.

11. The memory device according to claim 9, wherein the storage area of the memory cell comprises a local charge storage means.

* * * * *

UNITED STATES PATENT AND TRADEMARK OFFICE
CERTIFICATE OF CORRECTION

PATENT NO. : 7,145,807 B2 Page 1 of 1
APPLICATION NO. : 11/072694
DATED : December 5, 2006
INVENTOR(S) : Deppe et al.

It is certified that error appears in the above-identified patent and that said Letters Patent is hereby corrected as shown below:

Column 6, line 41; delete "urea" insert --area--

Signed and Sealed this

Twentieth Day of February, 2007

JON W. DUDAS
*Director of the United States Patent and Trademark Office*